United States Patent
Levi et al.

(10) Patent No.: US 11,543,852 B2
(45) Date of Patent: *Jan. 3, 2023

(54) MULTIHOST CLOCK SYNCHRONIZATION

(71) Applicant: MELLANOX TECHNOLOGIES, LTD., Yokneam (IL)

(72) Inventors: Dotan David Levi, Kiryat Motzkin (IL); Liron Mula, Ramat Gan (IL); Ariel Almog, Kohav Yahir (IL); Aviad Raveh, Bat Hefer (IL); Yuval Itkin, Zoran (IL)

(73) Assignee: MELLANOX TECHNOLOGIES, LTD., Yokneam (IL)

(*) Notice: Subject to any disclaimer, the term of this patent is extended or adjusted under 35 U.S.C. 154(b) by 247 days.

This patent is subject to a terminal disclaimer.

(21) Appl. No.: 16/779,611

(22) Filed: Feb. 2, 2020

(65) Prior Publication Data

US 2021/0141413 A1    May 13, 2021

Related U.S. Application Data

(60) Provisional application No. 62/931,838, filed on Nov. 7, 2019.

(51) Int. Cl.
*G06F 1/12* (2006.01)
*H03C 3/09* (2006.01)

(52) U.S. Cl.
CPC ............. *G06F 1/12* (2013.01); *H03C 3/0966* (2013.01)

(58) Field of Classification Search
CPC ................. G06F 1/12; G06F 9/44; G06F 1/32
See application file for complete search history.

(56) References Cited

U.S. PATENT DOCUMENTS

| | | |
|---|---|---|
| 5,392,421 A | 2/1995 | Lennartsson |
| 5,402,394 A | 3/1995 | Turski |
| 5,416,808 A | 5/1995 | Witsaman et al. |
| 5,491,792 A | 2/1996 | Grisham et al. |
| 5,564,285 A | 10/1996 | Jurewicz et al. |
| 5,592,486 A | 1/1997 | Lo et al. |
| 5,896,524 A | 4/1999 | Halstead, Jr. et al. |

(Continued)

FOREIGN PATENT DOCUMENTS

| | | |
|---|---|---|
| CN | 106817183 A | 6/2017 |
| CN | 108829493 A | 11/2018 |

(Continued)

OTHER PUBLICATIONS

ITU-T recommendation, "G.8273.2/Y.1368.2—Timing characteristics of telecom boundary clocks and telecom time slave clocks", pp. 1-50, Jan. 2017.

(Continued)

*Primary Examiner* — Keshab R Pandey
(74) *Attorney, Agent, or Firm* — Kligler & Associates Patent Attorneys Ltd

(57) ABSTRACT

In one embodiment, a network interface card device includes communication interfaces to provide data connection with respective local devices configured to run respective clock synchronization clients, at least one network interface to provide data connection between a packet data network and ones of the local devices, and a hardware clock to maintain a time value, and serve the clock synchronization clients.

24 Claims, 5 Drawing Sheets

(56) References Cited

U.S. PATENT DOCUMENTS

| | | |
|---|---|---|
| 6,055,246 A | 4/2000 | Jones |
| 6,084,856 A | 7/2000 | Simmons et al. |
| 6,144,714 A | 11/2000 | Bleiweiss et al. |
| 6,199,169 B1 | 3/2001 | Voth |
| 6,289,023 B1 | 9/2001 | Dowling et al. |
| 6,449,291 B1 | 9/2002 | Burns et al. |
| 6,535,926 B1 | 3/2003 | Esker |
| 6,556,638 B1 | 4/2003 | Blackburn |
| 6,718,476 B1 | 4/2004 | Shima |
| 6,918,049 B2 | 7/2005 | Lamb et al. |
| 7,111,184 B2 | 9/2006 | Thomas, Jr. et al. |
| 7,191,354 B2 | 3/2007 | Purho |
| 7,245,627 B2 | 7/2007 | Goldenberg et al. |
| 7,254,646 B2 | 8/2007 | Aguilera et al. |
| 7,334,124 B2 | 2/2008 | Pham et al. |
| 7,412,475 B1 | 8/2008 | Govindarajalu |
| 7,440,474 B1* | 10/2008 | Goldman ............ H04J 3/0664 370/503 |
| 7,447,975 B2 | 11/2008 | Riley |
| 7,483,448 B2 | 1/2009 | Bhandari et al. |
| 7,496,686 B2 | 2/2009 | Coyle |
| 7,535,933 B2 | 5/2009 | Zerbe et al. |
| 7,623,552 B2 | 11/2009 | Jordan et al. |
| 7,636,767 B2 | 12/2009 | Lev-Ran et al. |
| 7,650,158 B2* | 1/2010 | Indirabhai ............ H04W 56/00 455/41.1 |
| 7,656,751 B2 | 2/2010 | Rischar et al. |
| 7,750,685 B1 | 7/2010 | Bunch et al. |
| 7,904,713 B1 | 3/2011 | Zajkowski et al. |
| 7,941,684 B2 | 5/2011 | Serebrin et al. |
| 8,065,052 B2 | 11/2011 | Fredriksson et al. |
| 8,341,454 B1 | 12/2012 | Kondapalli |
| 8,370,675 B2 | 2/2013 | Kagan |
| 8,407,478 B2 | 3/2013 | Kagan et al. |
| 8,607,086 B2 | 12/2013 | Cullimore |
| 8,699,406 B1 | 4/2014 | Charles et al. |
| 8,879,552 B2 | 11/2014 | Zheng |
| 8,930,647 B1 | 1/2015 | Smith |
| 9,344,265 B2 | 5/2016 | Karnes |
| 9,397,960 B2 | 7/2016 | Arad et al. |
| 9,549,234 B1 | 1/2017 | Mascitto |
| 9,979,998 B1* | 5/2018 | Pogue ............ H04N 21/43637 |
| 10,014,937 B1 | 7/2018 | Di Mola et al. |
| 10,027,601 B2 | 7/2018 | Narkis et al. |
| 10,054,977 B2 | 8/2018 | Mikhaylov et al. |
| 10,164,759 B1 | 12/2018 | Volpe |
| 10,320,646 B2 | 6/2019 | Mirsky et al. |
| 10,637,776 B2 | 4/2020 | Iwasaki |
| 10,727,966 B1 | 7/2020 | Izenberg et al. |
| 2001/0006500 A1 | 7/2001 | Nakajima et al. |
| 2002/0027886 A1 | 3/2002 | Fischer et al. |
| 2002/0031199 A1 | 3/2002 | Rolston et al. |
| 2004/0096013 A1 | 5/2004 | Laturell et al. |
| 2004/0153907 A1 | 8/2004 | Gibart |
| 2005/0033947 A1 | 2/2005 | Morris et al. |
| 2005/0268183 A1 | 12/2005 | Barmettler |
| 2006/0109376 A1 | 5/2006 | Chaffee et al. |
| 2007/0008044 A1 | 1/2007 | Shimamoto |
| 2007/0072451 A1 | 3/2007 | Tazawa et al. |
| 2007/0104098 A1 | 5/2007 | Kimura et al. |
| 2007/0124415 A1 | 5/2007 | Lev-Ran et al. |
| 2007/0159924 A1* | 7/2007 | Vook .................. G08B 13/1672 367/127 |
| 2007/0266119 A1 | 11/2007 | Ohly |
| 2008/0069150 A1 | 3/2008 | Badt et al. |
| 2008/0285597 A1 | 11/2008 | Downey et al. |
| 2009/0257458 A1 | 10/2009 | Cui et al. |
| 2010/0280858 A1 | 11/2010 | Bugenhagen |
| 2011/0182191 A1 | 7/2011 | Jackson |
| 2012/0076319 A1 | 3/2012 | Terwal |
| 2013/0045014 A1 | 2/2013 | Mottahedin et al. |
| 2013/0215889 A1 | 8/2013 | Zheng et al. |
| 2013/0294144 A1 | 11/2013 | Wang et al. |
| 2013/0315265 A1 | 11/2013 | Webb, III et al. |
| 2014/0153680 A1 | 6/2014 | Garg et al. |
| 2014/0185632 A1 | 7/2014 | Steiner et al. |
| 2014/0253387 A1 | 9/2014 | Gunn et al. |
| 2014/0321285 A1 | 10/2014 | Chew et al. |
| 2015/0078405 A1 | 3/2015 | Roberts |
| 2015/0127978 A1 | 5/2015 | Cui et al. |
| 2015/0318941 A1 | 11/2015 | Zheng et al. |
| 2016/0072602 A1 | 3/2016 | Earl et al. |
| 2016/0110211 A1 | 4/2016 | Karnes |
| 2016/0277138 A1 | 9/2016 | Garg et al. |
| 2016/0315756 A1 | 10/2016 | Tenea et al. |
| 2017/0005903 A1 | 1/2017 | Mirsky |
| 2017/0214516 A1 | 7/2017 | Rivaud et al. |
| 2017/0302392 A1 | 10/2017 | Farra et al. |
| 2017/0331926 A1 | 11/2017 | Raveh et al. |
| 2017/0359137 A1 | 12/2017 | Butterworth et al. |
| 2018/0059167 A1 | 3/2018 | Sharf et al. |
| 2018/0152286 A1 | 5/2018 | Kemparaj et al. |
| 2018/0191802 A1 | 7/2018 | Yang et al. |
| 2018/0227067 A1 | 8/2018 | Hu et al. |
| 2018/0309654 A1 | 10/2018 | Achkir et al. |
| 2019/0007189 A1 | 1/2019 | Hossain et al. |
| 2019/0014526 A1 | 1/2019 | Bader et al. |
| 2019/0089615 A1 | 3/2019 | Branscomb et al. |
| 2019/0149258 A1 | 5/2019 | Araki et al. |
| 2019/0158909 A1 | 5/2019 | Kulkarni et al. |
| 2019/0273571 A1 | 9/2019 | Bordogna et al. |
| 2019/0319729 A1 | 10/2019 | Leong et al. |
| 2019/0349392 A1 | 11/2019 | Wetterwald et al. |
| 2019/0379714 A1 | 12/2019 | Levi et al. |
| 2020/0304224 A1 | 9/2020 | Neugeboren |
| 2020/0331480 A1 | 10/2020 | Zhang et al. |
| 2020/0344333 A1* | 10/2020 | Hawari .................. H04J 3/065 |
| 2020/0396050 A1 | 12/2020 | Perras et al. |
| 2020/0401434 A1 | 12/2020 | Thampi et al. |
| 2021/0218431 A1 | 7/2021 | Narayanan et al. |
| 2021/0297230 A1 | 9/2021 | Dror et al. |
| 2021/0318978 A1 | 10/2021 | Hsung |
| 2022/0066978 A1 | 3/2022 | Mishra et al. |

FOREIGN PATENT DOCUMENTS

| | | |
|---|---|---|
| EP | 1215559 B1 | 9/2007 |
| EP | 2770678 A1 | 8/2014 |
| JP | 2011091676 A | 5/2011 |
| WO | 2012007276 A1 | 1/2012 |
| WO | 2013124782 A2 | 8/2013 |
| WO | 2013143112 A1 | 10/2013 |
| WO | 2014029533 A1 | 2/2014 |
| WO | 204138936 A1 | 9/2014 |

OTHER PUBLICATIONS

Texas Instruments, "LMK05318 Ultra-Low Jitter Network Synchronizer Clock With Two Frequency Domains," Product Folder, pp. 1-86, Dec. 2018.

U.S. Appl. No. 16/683,309 Office Action dated Sep. 17, 2021.

U.S. Appl. No. 16/920,722 Office Action dated Aug. 12, 2021.

Dlugy-Hegwer et al., "Designing and Testing IEEE 1588 Timing Networks", Symmetricom, pp. 1-10, Jan. 2007.

Mellanox Technologies, "How to test 1PPS on Mellanox Adapters", pp. 1-6, Oct. 22, 2019 downloaded from https://community.mellanox.com/s/article/How-To-Test-1PPS-on-Mellanox-Adapters.

IEEE Std 1588-2002, "IEEE Standard for a Precision Clock Synchronization Protocol for Networked Measurement and Control Systems", IEEE Instrumentation and Measurement Society, pp. 1-154, Nov. 8, 2002.

IEEE Standard 1588™-2008: "IEEE Standard for a Precision Clock Synchronization Protocol for Networked Measurement and Control Systems", IEEE Instrumentation and Measurement Society, Revision of IEEE Standard 1588-2002, USA, pp. 1-289, Jul. 24, 2008.

Weibel et al., "Implementation and Performance of Time Stamping Techniques", 2004 Conference on IEEE 1588, pp. 1-29, Sep. 28, 2004.

Working Draft Project American National Standard T10/1799-D, "Information Technology—SCSI Block Commands—3 (SBC-3)", pp. 1-220, Revision 19, May 29, 2009.

(56) References Cited

OTHER PUBLICATIONS

"Infiniband Architecture: Specification vol. 1", pp. 1-1727, Release 1.2.1, Infiniband Trade Association, Nov. 2007.
Mellanox Technologies, "Mellanox ConnectX IB: Dual-Port InfiniBand Adapter Cards with PCI Express 2.0", pp. 1-2, USA, year 2008.
Gaist et al., U.S. Appl. No. 16/199,312, filed Nov. 26, 2018.
Almog et al U.S. Appl. No. 16/683,309, filed Nov. 14, 2019.
Wikipedia—"Precision Time Protocol", pp. 1-8, Aug. 24, 2019.
Levi et al, U.S. Appl. No. 16/799,873, filed Feb. 25, 2020.
U.S. Appl. No. 16/199,312 office action dated Feb. 14, 2020.
Lu et al., "A Fast CRC Update Implementation", Computer Engineering Laboratory, Electrical Engineering Department, pp. 113-120, Oct. 8, 2003.
Weibel, H., "High Precision Clock Synchronization according to IEEE 1588 Implementation and Performance Issues", Zurich University of Applied Sciences, pp. 1-9, Jan. 17, 2005.
IPCLOCK, "IEEE 1588 Primer," ip-clock.com, pp. 1-3, May 1, 2017 (downloaded from https://web.archive.org/web/20170501192647/http://ip-clock.com/ieee-1588-primer/).
U.S. Appl. No. 16/900,931 Office Action dated Apr. 28, 2022.
U.S. Appl. No. 16/683,309 Office Action dated Mar. 17, 2022.
U.S. Appl. No. 17/191,736 Office Action dated Apr. 26, 2022.
U.S. Appl. No. 17/120,313 Office Action dated Mar. 28, 2022.
EP Application # 21214269 Search Report dated May 2, 2022.
U.S. Appl. No. 17/148,605 Office Action dated May 17, 2022.
EP Application # 22151451.6 Search Report dated Jun. 17, 2022.
U.S. Appl. No. 17/120,313 Office Action dated Aug. 29, 2022.
U.S. Appl. No. 17/579,630 Office Action dated Oct. 24, 2022.
U.S. Appl. No. 17/191,736 Office Action dated Nov. 10, 2022.

* cited by examiner

```
                    ┌─ 44
46 — RECEIVE CLOCK SYNCHRONIZATION REQUEST MESSAGES GENERATED BY THE CLOCK
     SYNCHRONIZATION CLIENT OF THE RESPECTIVE LOCAL DEVICES
```

48 — UPDATE THE HARDWARE CLOCK RESPONSIVELY TO FIRST RESPECTIVE ONES OF THE CLOCK SYNCHRONIZATION REQUEST MESSAGES RECEIVED FROM THE DESIGNATED CONTROLLING DEVICE (ADJUSTED BY RESPECTIVE OFFSET) AND SEND RESPECTIVE CONFIRMATION MESSAGES TO THE DESIGNATED CONTROLLING DEVICE INDICATING THAT THE HARDWARE CLOCK WAS UPDATED RESPONSIVELY TO THE FIRST RESPECTIVE ONES OF THE CLOCK SYNCHRONIZATION REQUEST MESSAGES

50 — SEND THE RESPECTIVE CONFIRMATION MESSAGES TO THE NON-CONTROLLING DEVICE SPURIOUSLY INDICATING THAT THE HARDWARE CLOCK WAS UPDATED RESPONSIVELY TO THE SECOND RESPECTIVE ONES OF THE CLOCK SYNCHRONIZATION REQUEST MESSAGES RECEIVED FROM THE NON-CONTROLLING DEVICE WITHOUT UPDATING THE HARDWARE CLOCK RESPONSIVELY TO THE SECOND RESPECTIVE ONES OF THE CLOCK SYNCHRONIZATION REQUEST MESSAGES

FIG. 3

MULTIHOST CLOCK SYNCHRONIZATION

RELATED APPLICATION INFORMATION

The present application claims priority from U.S. Provisional Patent Application Ser. No. 62/931,838 of Levi, et al., filed Nov. 7, 2019, the disclosure of which is hereby incorporated herein by reference.

FIELD OF THE INVENTION

The present invention relates to computing devices, and in particular, but not exclusively to clock synchronization.

BACKGROUND

In computer networks, each node (such as a switch or endpoint) typically has its own real-time clock. In many applications, it is desirable that the real-time clocks of different nodes be precisely synchronized. Such synchronization can be difficult to achieve, however, due to the latency and jitter involved in distributing clock synchronization messages among the nodes.

The Precision Time Protocol (PTP) was conceived as a solution to this problem. PTP is defined in IEEE standard 1588-2002, which is incorporated herein by reference. This protocol enables network nodes, using messaging between the nodes and a master device, to determine the offset of their respective clocks to levels of accuracy in the nanosecond range. For maximum accuracy in measuring the clock offsets, hardware-based time stamping is generally used, as described, for example, by Weibel and Bechaz in "Implementation and Performance of Time Stamping Techniques," 2004 Conference on IEEE 1588 (Sep. 28, 2004), which is incorporated herein by reference. A PTP hardware clock (PHC) is a hardware clock (e.g., including an oscillator and a counter), which runs according to PTP format. The PHC is synchronized to a master in the network.

U.S. Pat. No. 8,370,675 to Kagan describes a method for clock synchronization which includes computing an offset value between a local clock time of a real-time clock circuit and a reference clock time, and loading the offset value into a register that is associated with the real-time clock circuit. The local clock time is then summed with the value in the register so as to give an adjusted value of the local clock time that is synchronized with the reference clock.

In conventional computer systems, a host computer is linked to a network using a network interface card (NIC), which is connected to the internal bus of the host. The most common example of this type of connection is the use of Ethernet network adapter cards, which plug into the Peripheral Component Interface express (PCIe) bus of a personal computer and link the computer to a 10BASE-T or 100BASE-T local-area network (LAN). Ethernet cards of this sort are widely available and inexpensive. They provide the necessary physical layer connection between the host and the serial LAN or WAN medium, as well as performing some media access control (MAC) layer functions. Network- and transport-layer protocol functions, such as Internet Protocol (IP) and Transmission Control Protocol (TCP) processing, are typically performed in software by the host.

As network speeds increase, up to 10 Gigabit Ethernet (GbE), 25 GbE, 40 GbE, 50 GbE, 100 GbE, 220 GbE, for example, this sort of simple NIC is no longer adequate. Working in environment of these network speeds at wire speed typically requires that the NIC have a much faster and more costly physical interface and MAC handling functions.

It is also desirable that the NIC take on a larger share of the higher-level protocol processing functions. NICs have been introduced with "protocol offloading" capability, in the form of dedicated hardware processing resources to relieve the host of network layer (IP) processing and even transport and higher-layer functions. Such hardware resources reduce the processing burden on the host and therefore eliminate a major bottleneck in exploiting the full bandwidth available on the network, but they also add substantially to the cost of the NIC. Since a typical host communicates with a LAN or WAN only intermittently, in short bursts, the high-speed processing capabilities of the NIC are unused most of the time.

The computer industry has moved towards fast, packetized, serial input/output (I/O) bus architectures, in which computing hosts and peripherals, such as NICs, are linked by a system area network (SAN), commonly referred to as a switching fabric. A number of architectures of this type have been proposed, culminating in the "InfiniBand™" (IB) architecture.

IB fabrics are well suited for multi-processor systems and allow input/output (I/O) units, such as a network interface device with a suitable TCA, to communicate with any or all of the processor nodes in a system. In this manner, a NIC can be used by multiple hosts over an IB fabric to access an external network, such as an Ethernet LAN or WAN. For example, U.S. Pat. No. 7,245,627 to Goldenberg, et al., describes a network interface device that includes a fabric interface, adapted to exchange messages over a switch fabric with a plurality of host processors, the messages containing data, and a network interface, including one or more ports adapted to be coupled to a network external to the switch fabric. Message processing circuitry is coupled between the fabric interface and the network interface, so as to enable at least first and second host processors among the plurality of the host processors to use a single one of the ports substantially simultaneously so as to transmit and receive frames containing the data over the network.

Multi-Host technology enables scalable Cloud, Web 2.0 and high-performance data centers to design and build scale-out heterogeneous compute and storage racks, with direct connectivity between compute elements and the network. Significantly improving cost savings, flexibility, and Total Cost of Ownership (TCO), comprehensive multi-host technology provides better power and performance, while achieving maximum data processing and data transfer at minimum capital and operational expenses. Multi-Host technology allows multiple compute or storage hosts to connect into a single interconnect adapter, by separating the adapter PCIe interface into several independent PCIe interfaces. Each interface connects to a separate host central processing unit (CPU) without performance degradation. Multi-Host Technology typically provides large cost-cutting benefits to customers. For example, reducing the number of cables, NICs and switch ports required by four independent servers, from four to only one of each, the technology also significantly reduces switch port management and power usage.

SUMMARY

There provided in accordance with an embodiment of the present disclosure, a network interface card device, including respective communication interfaces configured to provide data connection with respective local devices configured to run respective clock synchronization clients, at least one network interface to provide data connection between a packet data network and ones of the local devices, and a hardware clock configured to maintain a time value, and serve the clock synchronization clients.

Further in accordance with an embodiment of the present disclosure, the device includes a clock controller configured to designate one of the local devices as a controlling device for updating the hardware clock, receive clock synchronization request messages generated by the clock synchronization clients of the respective local devices, update the hardware clock responsively to first respective ones of the clock synchronization request messages received from the designated controlling device, and send respective confirmation messages to the designated controlling device indicating that the hardware clock was updated responsively to the first respective ones of the clock synchronization request messages, and send respective confirmation messages to a non-controlling device of the local devices spuriously indicating that the hardware clock was updated responsively to second respective ones of the clock synchronization request messages received from the non-controlling device.

Still further in accordance with an embodiment of the present disclosure the clock controller is configured to send the respective confirmation messages to the non-controlling device without updating the hardware clock responsively to the second respective ones of the clock synchronization request messages.

Additionally in accordance with an embodiment of the present disclosure the clock controller is configured to select the controlling device in accordance with a selection method responsively to any one or more of the following a lowest network address of respective ones of the local devices, a highest network address of respective ones of the local devices, an earliest one of respective ones of the local devices to boot, a lowest or highest communication bus device index, a controlling device having a most accurate oscillator of the local devices, an initial controlling device indicated by a baseboard management controller, a random selection from respective ones of the local devices, or selection from an ordered list of respective ones of the local devices on a round robin basis.

Moreover, in accordance with an embodiment of the present disclosure the selection method is commanded by the baseboard management controller.

Further in accordance with an embodiment of the present disclosure the clock controller is configured to re-designate one of the local devices as a controlling device at least one re-designation criterion, responsively to any one or more of the following the designated controlling device being non-responsive for more than a threshold time period, the designated controlling device being designated for a given or random time period, detecting a power-state change of the designated controlling device, detecting a driver start and/or driver stop on the designated controlling device, or detecting a driver start and/or driver stop on one of the local devices.

Still further in accordance with an embodiment of the present disclosure the at least one re-designation criterion is commanded by a baseboard management controller.

Additionally, in accordance with an embodiment of the present disclosure the clock controller is configured to receive a time value request message from the non-controlling device, query the hardware clock for a time value responsively to the time value request message, and send the time value to the non-controlling device.

Moreover, in accordance with an embodiment of the present disclosure the local devices include network hosts.

Further in accordance with an embodiment of the present disclosure the local devices include a baseboard management controller.

Still further in accordance with an embodiment of the present disclosure the designated controlling device is the baseboard management controller.

Additionally, in accordance with an embodiment of the present disclosure the baseboard management controller is designated as the controlling device responsively to a command from the baseboard management controller to designate the baseboard management controller as the controlling device.

Moreover in accordance with an embodiment of the present disclosure, the device includes a memory configured to store respective offsets of respective ones of the local devices, the clock controller being configured to update the hardware clock responsively to the first respective clock synchronization request messages received from the designated controlling device adjusted by a respective one of the offsets of the designated controlling device of the local devices, receive a time value request message from a first one of the local devices, query the hardware clock for a time value responsively to the time value request message, adjust the time value responsively to a respective one of the offsets of the first local device, and send the adjusted time value to the first local device.

There is also provided in accordance with another embodiment of the present disclosure, a network interfacing method, including providing data connection with respective local devices configured to run respective clock synchronization clients, providing data connection between a packet data network and ones of the local devices, maintaining a time value by a hardware clock, designating one of the local devices as a controlling device for updating the hardware clock, receiving clock synchronization request messages generated by the clock synchronization clients of the respective local devices, updating the hardware clock responsively to first respective ones of the clock synchronization request messages received from only the designated controlling device, and sending respective confirmation messages to the designated controlling device indicating that the hardware clock was updated responsively to the first respective ones of the clock synchronization request messages, and sending respective confirmation messages to a non-controlling device of the local devices spuriously indicating that the hardware clock was updated responsively to second respective ones of the clock synchronization request messages received from the non-controlling device.

Further in accordance with an embodiment of the present disclosure the sending the respective confirmation messages to the non-controlling device includes sending the respective confirmation messages to the non-controlling device without updating the hardware clock responsively to the second respective ones of the clock synchronization request messages.

Still further in accordance with an embodiment of the present disclosure, the method includes selecting includes designating the controlling device in accordance with a selection method responsively to any one or more of the following a lowest network address of respective ones of the local devices, a highest network address of respective ones of the local devices, an earliest one of respective ones of the local devices to boot, a lowest or highest communication bus device index, a controlling device having a most accurate oscillator of the local devices, an initial controlling device indicated by a baseboard management controller, a random selection from respective ones of the local devices, or selection from an ordered list of respective ones of the local devices on a round robin basis.

Additionally, in accordance with an embodiment of the present disclosure the selection method is commanded by the baseboard management controller.

Moreover in accordance with an embodiment of the present disclosure, the method includes re-designating one of the local devices as a controlling device at least one re-designation criterion, responsively to any one or more of the following the designated controlling device being non-responsive for more than a threshold time period, the designated controlling device being designated for a given or random time period, detecting a power-state change of the designated controlling device, detecting a driver start and/or driver stop on the designated controlling device, or detecting a driver start and/or driver stop on one of the local devices.

Further in accordance with an embodiment of the present disclosure the at least one re-designation criterion is commanded by a baseboard management controller.

Still further in accordance with an embodiment of the present disclosure, the method includes receiving a time value request message from the non-controlling device, querying the hardware clock for a time value responsively to the time value request message, and sending the time value to the non-controlling device.

Additionally, in accordance with an embodiment of the present disclosure the local devices include network hosts.

Moreover, in accordance with an embodiment of the present disclosure the local devices include a baseboard management controller.

Further in accordance with an embodiment of the present disclosure the designated controlling device is the baseboard management controller.

Still further in accordance with an embodiment of the present disclosure the baseboard management controller is designated as the controlling device responsively to a command from the baseboard management controller to designate the baseboard management controller as the controlling device.

Additionally in accordance with an embodiment of the present disclosure, the method includes storing respective offsets of respective ones of the local devices, wherein the updating includes updating the hardware clock responsively to the first respective clock synchronization request messages received from the designated controlling device adjusted by a respective one of the offsets of the designated controlling device of the local devices, the method further including receiving a time value request message from a first one of the local devices, querying the hardware clock for a time value responsively to the time value request message, adjusting the time value responsively to a respective one of the offsets of the first local device, and sending the adjusted time value to the first local device.

There is also provided in accordance with still another embodiment of the present disclosure, a network interface card device, including respective communication interfaces configured to provide data connection with respective local devices configured to run respective clock synchronization clients, at least one network interface to provide data connection between a packet data network and ones of the local devices, a hardware clock configured to maintain a time value, a memory configured to store respective offsets of respective ones of the local devices, and a clock controller configured to receive clock synchronization request messages generated by a first one of the clock synchronization clients of a first respective one of the local devices, update the hardware clock responsively to the clock synchronization request messages adjusted by a respective one of the offsets of the first respective one of the local devices, receive a time value request message from a second one of the local devices, query the hardware clock for a time value responsively to the time value request message, adjust the time value responsively to a respective one of the offsets of the second local device, and send the adjusted time value to the second local device.

There is also provided in accordance with still another embodiment of the present disclosure, a network interfacing method, including providing data connection with respective local devices configured to run respective clock synchronization clients, providing data connection between a packet data network and ones of the local devices, maintaining a time value by a hardware clock, storing respective offsets of respective ones of the local devices, receiving clock synchronization request messages generated by a first one of the clock synchronization clients of a first respective one of the local devices, updating the hardware clock responsively to the clock synchronization request messages adjusted by a respective one of the offsets of the first respective one of the local devices, receiving a time value request message from a second one of the local devices, querying the hardware clock for a time value responsively to the time value request message, adjusting the time value responsively to a respective one of the offsets of the second local device, and sending the adjusted time value to the second local device.

There is also provided in accordance with still another embodiment of the present disclosure, a system including a network interface card device including respective communication interfaces configured to provide data connection with respective local devices configured to run respective clock synchronization clients, at least one network interface to provide data connection between a packet data network and ones of the local devices, a hardware clock configured to maintain a time value, and a clock controller configured to designate one of the local devices as a controlling device for updating the hardware clock, receive clock synchronization request messages generated by the clock synchronization clients of the respective local devices, update the hardware clock responsively to first respective ones of the clock synchronization request messages received from the designated controlling device, and send respective confirmation messages to the designated controlling device indicating that the hardware clock was updated responsively to the first respective ones of the clock synchronization request messages, and send respective confirmation messages to a non-controlling device of the local devices spuriously indicating that the hardware clock was updated responsively to second respective ones of the clock synchronization request messages received from the non-controlling device, and the local devices including network hosts and a baseboard management controller.

Moreover in accordance with an embodiment of the present disclosure the clock controller is configured to send the respective confirmation messages to the non-controlling device indicating that the hardware clock was updated responsively to the second respective ones of the clock synchronization request messages received from the non-controlling device without updating the hardware clock responsively to the second respective ones of the clock synchronization request messages.

Further in accordance with an embodiment of the present disclosure the clock controller is configured to select the controlling device in accordance with a selection method, and the baseboard management controller is configured to command the clock controller to use the selection method.

Still further in accordance with an embodiment of the present disclosure the baseboard management controller is configured to command the clock controller to designate an initial controlling device of the local devices as the controlling device.

Additionally, in accordance with an embodiment of the present disclosure the clock controller is configured to re-designate one of the local devices as a controlling device at least one re-designation criterion, and the baseboard management controller is configured to command the clock controller to use the at least one re-designation criterion.

Moreover, in accordance with an embodiment of the present disclosure the designated controlling device is the baseboard management controller.

Further in accordance with an embodiment of the present disclosure the baseboard management controller is configured to command the clock controller to designate the baseboard management controller as the controlling device.

BRIEF DESCRIPTION OF THE DRAWINGS

The present invention will be understood from the following detailed description, taken in conjunction with the drawings in which:

FIG. 3 is a flowchart including steps in a method of synchronization the hardware clock in the network interface card device of the system of FIG. 1;

DESCRIPTION OF EXAMPLE EMBODIMENTS

Overview

Figure 1:
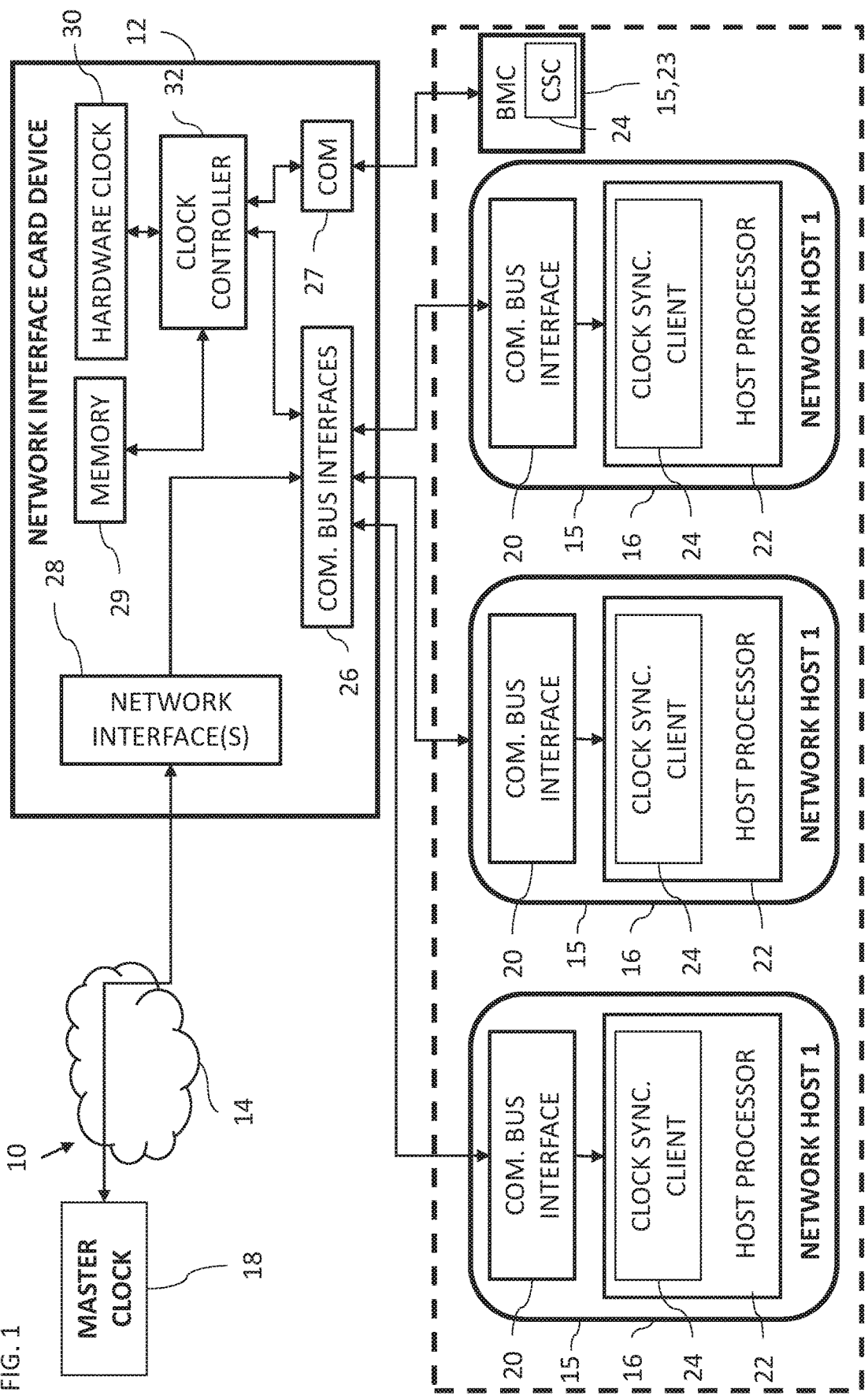
FIG. 1 is a block diagram view of a multihost system constructed and operative in accordance with an embodiment of the present invention.

A network interface card (NIC) device may provide data connection for multiple network hosts to a packet data network. The NIC device may include a single hardware clock, such as a Precision Time Protocol (PTP) hardware clock (PHC), or one hardware clock per Ethernet port. Each network host typically runs a clock synchronization client, e.g., a PTP client such as ptp41 in a Linux Kernel, which communicates with a boundary clock (BC) or grand master (GM) somewhere in the packet data network, for example, using PTP get messages to receive a time value from the BC or GM. The received time value may be used by the respective network host to update its local clock. The term "time value", as used in the specification and claims, is defined to include a phase value and/or a frequency value.

The IEEE 1588 standards describe a hierarchical master-slave architecture for clock distribution. Under this architecture, a time distribution system consists of one or more network segments, and one or more clocks. An ordinary clock is a device with a single network connection and is either the master or slave for a synchronization reference. A boundary clock has multiple network connections and accurately synchronizes one network segment to another. A synchronization master is selected for each network segment. The root timing reference is called the grandmaster, which transmits synchronization information to clocks residing on its network segment. The boundary clocks with a presence on that segment then relay accurate time to the other segments to which they are also connected.

The clock synchronization client of each network host tries to discipline or adjust the hardware clock in the NIC device based on the time value in that network host. The clock synchronization clients are typically unaware that they are sharing the same NIC device. Although the time values of the respective clocks in the respective network hosts should be the same because they are in the same network segment and based on the same time value of the BC or GM, there may be differences in the time values due to various clock drift factors. For example, the differences may arise because the client software may not be deterministic, and disciplining is not a standard procedure, but rather an algorithm implemented by the clock synchronization client, which means that if the different hosts run different clock synchronization clients, they will have different time values since the algorithm is different, and even if the hosts are running the same clock synchronization client (whether by design or not), the clocks may have different values because the software is invoked at different times, and each host receives different synchronization messages subject to a different path delay between the host and the GM or BC. Therefore, allowing the network hosts to independently discipline the hardware clock in the NIC device may lead to a very inaccurate and unpredictable time value for the hardware clock.

One solution to the above problem is to provide respective hardware clocks in the NIC device for the respective network hosts. However, this solution is generally both expensive and not scalable.

Embodiments of the present invention provide a multihost NIC device with a single hardware clock which is disciplined by one of the network hosts, designated as a controlling device, while allowing the other network hosts, termed non-controlling devices, to communicate with the NIC device as though those non-controlling devices are also disciplining the hardware clock, but are in fact not. In some embodiments, more than one hardware clock could be used.

In some embodiments, the NIC device includes respective communication bus interfaces providing data connection with respective network hosts. Each network host includes a host processor running a clock synchronization client. The NIC device also includes at least one network interface to provide data connection between a packet data network and the respective network hosts. The NIC device includes a hardware clock maintaining a time value, and serves the clock synchronization clients.

The NIC device also includes a clock controller which designates one of the network hosts as a controlling device for updating the hardware clock. The other network host(s) may be designated as non-controlling device(s) either explicitly or implicitly. The clock controller may select the controlling device responsively to any suitable criteria, for example, one or more of the following: a lowest network address of the network hosts; a highest network address of the network hosts; an earliest one of the network hosts to boot; a controlling device having a most accurate oscillator from the network hosts; or a lowest or highest communication bus device index (e.g., PCIe device index). Other selection criteria may further enhance security, for example, one or more of the following: a random selection from at least some of the network hosts; or selection from an ordered list of at least some of the network hosts on a round robin basis. The selection method to be used by the clock controller may be commanded by a baseboard management controller, which issues a command to the clock controller.

The baseboard management controller may command the clock controller to select a specific one of the network hosts as the initial controlling device. In some embodiments, the baseboard management controller may command the clock controller to select the baseboard management controller as the controlling device for a period of time or until informed otherwise. In some embodiments, the baseboard management controller may be included in a list of local devices (including the network hosts) from which the clock controller selects the controlling device.

The clock controller receives clock synchronization request messages generated by the clock synchronization clients of the respective local devices (e.g., network hosts and optionally the baseboard management controller), for example, set_time( ) and set_freq( ) PTP messages. The clock controller updates the hardware clock responsively to the clock synchronization request messages received from only the designated controlling device, and sends respective confirmation messages to the designated controlling device indicating that the hardware clock was updated responsively to the respective clock synchronization request messages. On the other hand, the clock controller ignores clock synchronization request messages received from the non-controlling device(s) with regard to updating the hardware clock. Nevertheless, the clock controller sends respective confirmation messages to the non-controlling device(s) spuriously indicating that the hardware clock was updated responsively to the clock synchronization request messages received from the non-controlling device(s) without in fact updating the hardware clock.

The clock controller also receives time value request messages from the controlling and non-controlling devices and responds with the time value provided by the hardware clock. For example, the clock controller may receive a time value request message (e.g., a get_time( ) and/or a get_freq( ) message) from a non-controlling device. The clock controller queries the hardware clock for a time value responsively to the time value request message, and sends the time value provided by the hardware clock to the non-controlling device.

Therefore, the NIC device allows the clock synchronization clients of the network hosts to function according to a protocol, such as PTP, since the single hardware clock represents a common clock set according to the BC or GM and the NIC device "appears" to be complying with the protocol by replying to the various requests, e.g., set and get messages, according to the protocol. The NIC device also provides a very accurate clock synchronization between the network hosts connected to the NIC device based on the BC or GM as the hardware clock is only set by the clock synchronization client running on the controlling device. The NIC device also allows a scalable solution, as the hardware clock is updated by one network host and is independent of the number of network hosts connected to the NIC device.

In many implementations it is easier to update the functionality of the NIC device than it is to change the functionality of the clock synchronization clients running on the network hosts, which may involve modifying open source code already running with an existing application and deployment, for example.

In some embodiments, a memory stores respective offsets of respective local devices. The hardware clock maintains a time value which may include a phase value and/or a frequency value. The phase value may be represented by the value of a counter, which is advanced according to the frequency value. The different local devices, while being synchronized with the hardware clock, may maintain a phase value which is offset from the phase of the hardware clock by a given static value. For example, the network hosts may be providing services for different time zones, where one network host is providing services in the UK, another network host in New York, and yet another network host in New Delhi. Therefore, the different network hosts need to maintain times according to their local time zone. The hardware clock may have a phase which is correct for a particular time zone, e.g., Pacific Time, or it may have a phase which is not linked to a particular time zone. In order for the time value of the hardware clock to be used by the local devices, or for the time value of the hardware clock to be set by one of the local devices (the controlling device), the time values retrieved by the clock controller from the hardware clock, or time values written to the hardware clock, are adjusted based on the respective offsets of the respective local devices. Although the offsets may generally be static values, the offsets may change occasionally, e.g., due to changes to, or from, daylight savings time.

The clock controller may re-designate one of the non-controlling devices as a controlling device responsively to the designated controlling device being non-responsive (e.g., down) for more than a threshold time period, or other re-designation criteria, such as a reason-based or a time-based criteria, such as any one or more of the following: the designated controlling device has been designated for a given or random time period; detecting a power-state change of the designated controlling device; detecting a driver start and/or driver stop on the designated controlling device; or detecting a driver start and/or driver stop on one of the network hosts. The re-designation criterion (or criteria) to be used by the clock controller may be commanded by the baseboard management controller to the clock controller. The re-designation criteria may be persistent in the network interface card device so that once set, it is applied even after the network interface card device resets, or non-persistent and therefore requires re-configuration on reset of the network interface card device. Using the reason or time-based criteria may further enhance security.

The NIC device allows each host in a server to operate without knowledge of: the server topology; the number of hosts in the server; and the fact that the NIC device is shared with others hosts in the server.

Additionally, or alternatively, the clock controller may block synchronization messages from the GM or BC to the non-controlling devices and automatically respond to the GM or BC "on behalf" of the non-controlling devices, thereby reducing processing overhead in the NIC device.

System Description

Documents incorporated by reference herein are to be considered an integral part of the application except that, to the extent that any terms are defined in these incorporated documents in a manner that conflicts with definitions made explicitly or implicitly in the present specification, only the definitions in the present specification should be considered.

Reference is now made to FIG. 1, which is a block diagram view of a multihost system 10 constructed and operative in accordance with an embodiment of the present invention. The multihost system 10 includes a network interface card device 12, a packet data network 14, multiple local devices 15 (e.g., network hosts 16 (only three shown for the sake of simplicity) and a baseboard management controller 23), and a master clock 18 such as a grand master (GM) clock or a boundary clock (BC). The master clock 18 may include any suitable clock, such as, an atomic clock. The term "local device" as used in the specification and claims is defined herein as a device which is connected directly to the network interface card device 12 via a wired link but not via the packet data network 14.

Each network host 16 includes a communication bus interface 20 and a host processor 22, which is configured to run a clock synchronization client 24, such as a PTP client. The clock synchronization client 24 is configured to communicate with the master clock 18 in the packet data network 14, for example, using PTP "get" messages to receive a time value from the master clock 18 via the network interface card device 12 and the packet data network 14. The received time value may be used by the respective network host 16 to update its local clock (not shown). The baseboard management controller 23 may also be configured to run its own clock synchronization client 24.

The baseboard management controller 23 may be a baseboard management controller shared by the network hosts 16 or a chassis controller performing system level tasks. The baseboard management controller 23 may be a specialized service processor that monitors the physical state of a computer, network server or other hardware device using sensors and communicating with a system administrator through an independent connection. The baseboard management controller 23 may use Intelligent Platform Management Interface (IPMI) or any other suitable management method such as those defined by Distributed Management Task Force (DMTF) standards or be based on any other suitable control method or combination of multiple methods. The baseboard management controller 23 may be contained in the motherboard or main circuit board of the device to be monitored. The sensors of the baseboard management controller 23 may measure internal physical variables such as temperature, humidity, power-supply voltage, fan speeds, communications parameters and operating system (OS) functions. If any of the variables stray outside specified limits, the administrator may be notified for corrective action to be taken, e.g., by remote control. In some embodiments, corrective action may be controlled by the baseboard management controller 23 without remote control or in combination with remote control. In practice, some or all of the functions of the baseboard management controller 23 may be combined in a single physical component or, alternatively, implemented using multiple physical components. These physical components may comprise hard-wired or programmable devices, or a combination of the two. In some embodiments, at least some of the functions of the baseboard management controller 23 may be carried out by a programmable processor under the control of suitable software, such as firmware or driver software. This software may be downloaded to a device in electronic form, over a network, for example. Alternatively, or additionally, the software may be stored in tangible, non-transitory computer-readable storage media, such as optical, magnetic, or electronic memory.

The network interface card device 12 includes respective communication interfaces 26 (e.g., communication bus interfaces) configured to provide data connection with respective ones of the network hosts 16 via the respective communication bus interfaces 20 of the respective network hosts 16. The communication bus interfaces 20 and the communication bus interfaces 26 may operate in accordance with any suitable communication bus standard for example, but not limited to, peripheral component interconnect express (PCIe).

The network interface card device 12 may also include a communication interface 27 configured to provide data connection with the baseboard management controller 23. The communication interface 27 may be a sideband interface such as System Management Bus (SMBus) interface, reduced media-independent interface (RMII) Based Transport Interface (RBT), or a dedicated PCIe interface, by way of example only. In some embodiments, the communication interface 27 may be comprised in the communication bus interfaces 26.

The network interface card device 12 includes at least one network interface 28 configured as at least one ingress port and at least one egress port to provide data connection between the packet data network 14 and the respective network hosts 16 and optionally the baseboard management controller 23. The network interface card device 12 also includes a hardware clock 30, such as a PHC, configured to maintain a time value (including phase value and/or frequency value), for example, using a counter, which represents the phase value of the time value, the counter being advanced according to the frequency value of the time value. The hardware clock may comprise an oscillator among other elements. The hardware clock 30 is configured to serve the clock synchronization clients 24 of the respective local devices 15 (e.g., network hosts 16 and optionally the baseboard management controller 23).

The network interface card device 12 also includes a clock controller 32. The functionality of the clock controller 32 is described in more detail with reference to FIGS. 2-6. In practice, some or all of the functions of the clock controller 32 may be combined in a single physical component or, alternatively, implemented using multiple physical components. These physical components may comprise hard-wired or programmable devices, or a combination of the two. In some embodiments, at least some of the functions of the clock controller 32 may be carried out by a programmable processor under the control of suitable software, such as firmware or driver software. This software may be downloaded to a device in electronic form, over a network, for example. Alternatively, or additionally, the software may be stored in tangible, non-transitory computer-readable storage media, such as optical, magnetic, or electronic memory.

The network interface card device 12 may also include a memory 29. The memory 29 is described in more detail with reference to FIGS. 4 and 5.

Figure 2:
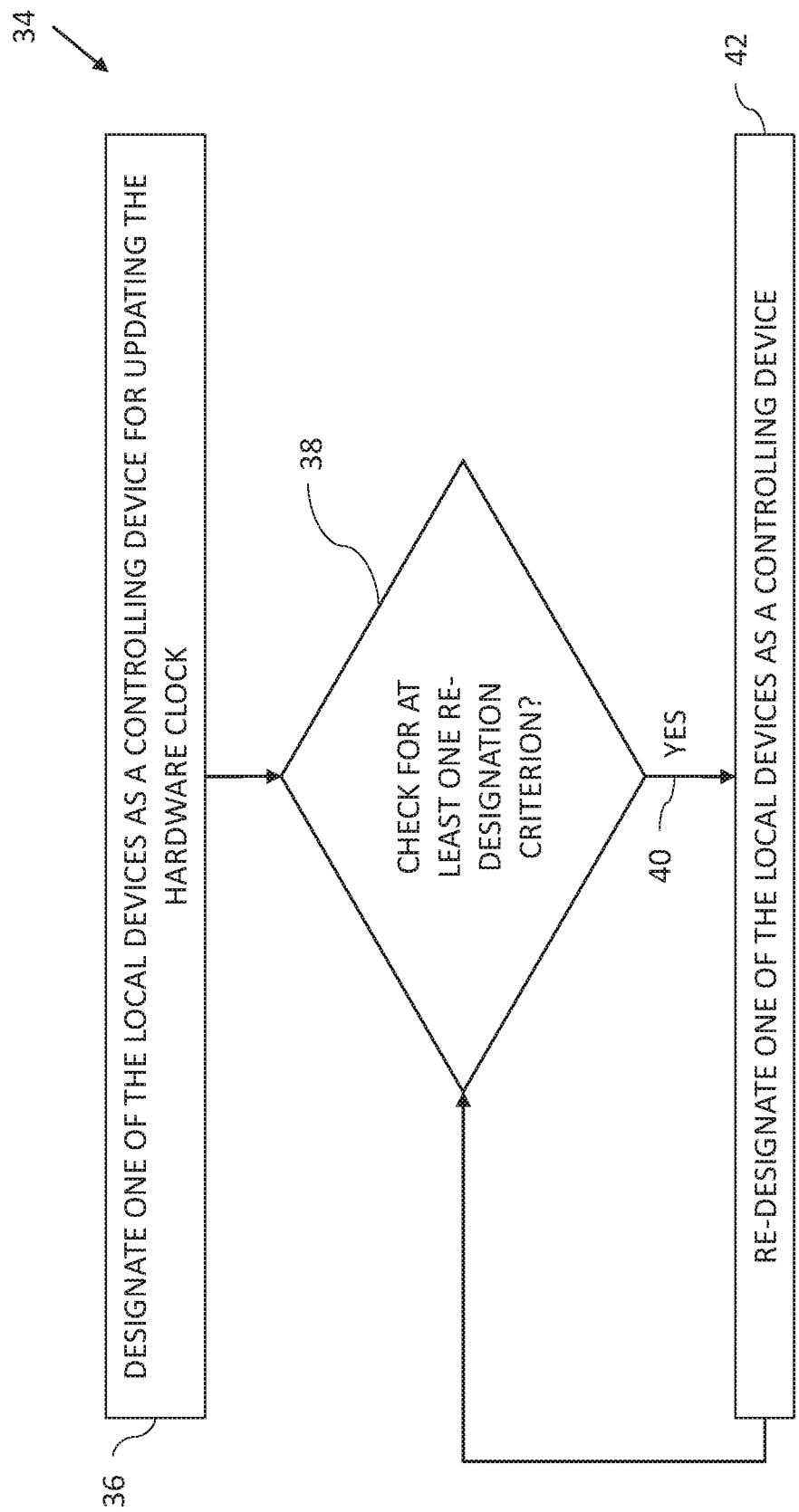
FIG. 2 is a flowchart including steps in a method of designating a controlling device in the system of FIG. 1.

Reference is now made to FIG. 2, which is a flowchart 34 including steps in a method of designating a controlling device in the system 10 of FIG. 1. Reference is also made to FIG. 1. The clock controller 32 is configured to designate (block 36) one of the local devices 15 (e.g., one of the network hosts 16 or optionally the baseboard management controller 23) as a controlling device for updating the hardware clock 30. In some embodiments, the baseboard management controller 23 may be designated as the controlling device responsively to a command from the baseboard management controller 23 to designate the baseboard management controller 23 as the controlling device. In other embodiments, the baseboard management controller 23 is not a candidate for being selected as the controlling device. The other local device(s) 15 may be explicitly designated as non-controlling device(s) 15. In some embodiments, the other local device(s) 15 are not explicitly designated as non-controlling device(s) 15, but are implicitly non-controlling devices due to the controlling device 15 being designated as such. The clock controller 32 is configured to designate the controlling device 15 in accordance with a selection method, for example, based on one or more of the following: a lowest network address of the local devices 15, or of some of the local devices 15; a highest network address of the local devices 15, or of some of the local devices 15; an earliest one of the local devices 15 to boot; or a lowest or highest communication bus device index (e.g., PCIe device index); a controlling device having a most accurate oscillator of the local devices 15; a random selection from respective ones of the local devices 15; or selection from an ordered list of respective ones of the local devices 15 on a round robin basis. The selection method to be used by the clock controller 32 may be commanded by the baseboard management controller 23, which issues a command to the clock controller 32.

The controlling device with the most accurate oscillator may be found using any suitable method, for example, but not limited to, a best master clock algorithm (BMCA) which may be run by the clock controller 32 or another processor in the network interface card device 12 or by an entity external to the network interface card device 12.

In some embodiments, an initial controlling device to be selected from the local devices 15 by the clock controller 32 may be indicated by the baseboard management controller 23, and subsequent controlling devices may be selected by the clock controller 32 using any suitable method, for example, using a method determined by the baseboard management controller 23.

The clock controller 32 is configured to check (block 38) for at least one re-designation criterion, for example, the controlling device 15 being non-responsive (e.g., down) for more than a threshold time period. The re-designation criteria/criterion may include any one or more of the following, by way of example: the designated controlling device 15 is non-responsive for more than a threshold time period; the designated controlling device 15 has been designated for a given or random time period; detecting a power-state change of the designated controlling device 15; detecting a driver start and/or driver stop on the designated controlling device 15; or detecting a driver start and/or driver stop on one of the local devices 15. The re-designation criterion (or criteria) may be commanded by the baseboard management controller 23, which issues a command to the clock controller 32. The power-state change and driver start and/or driver stop may be detected by the clock controller 32 via PCIe signals from the local devices 15, by way of example.

If the re-designation criterion (or criteria) is (or are) fulfilled (e.g., the controlling device 15 is non-responsive for more than the threshold time period) (branch 40), the clock controller 32 is configured to re-designate (block 42) another one of the local devices 15 as a controlling device. The re-designation of one of the local devices 15 in the step of block 42 may be performed based on one of the selection methods described above with reference to the step of block 36. The re-designation may be contingent on fulfilling one of a plurality of re-designation criteria or more than one (e.g., all, or less than all) of the re-designation criteria. The step of block 38 is repeated for the newly designated controlling device 15.

The re-designation criterion (or criteria) may be persistent in the network interface card device 12 so that once set, it is applied even after the network interface card device 12 resets, or non-persistent and therefore requires re-configuration on reset of the network interface card device 12.

Reference is now made to FIG. 3, which is a flowchart 44 including steps in a method of synchronization the hardware clock 30 in the network interface card device 12 of the system 10 of FIG. 1. Reference is also made to FIG. 1.

The clock synchronization client 24 of each local device 15 tries to discipline or adjust the hardware clock 30 in the NIC device 12 based on the time value stored in the local clock (not shown) of that local device 15. The clock synchronization client 24 of each local device 15 is configured to generate clock synchronization request messages, such as set_time( ) and set_freq( ) PTP messages, for sending to the clock controller 32 via the respective communication bus interface 20 and the respective communication bus interface 26.

The examples given below assume that "network host 2" is the designated controlling device 15 whereas network hosts 1 and 3 (and the baseboard management controller 23) are non-controlling devices 15.

The clock controller 32 is configured to receive (block 46) the clock synchronization request messages generated by the clock synchronization clients 24 of the respective local devices 15 (e.g., network hosts 1-3). The clock controller 32 is configured to update (block 48) the hardware clock 30 responsively to ones of the clock synchronization request messages (for example, but not limited to, "clock_settime" and "clock_adjtime" in Linux) received from only the designated controlling device 15 (e.g., network host 2), and send respective confirmation messages to the designated controlling device 15 (e.g., network host 2) indicating that the hardware clock 30 was updated responsively to the respective clock synchronization request messages used to update the hardware clock 30. The term "only the designated controlling device" as used in the specification and claims, is defined to include updating the hardware clock 30 responsively to messages received from the controlling device 15, but not responsively to messages received from the non-controlling device(s) 15.

The clock controller 32 is configured to send (block 50) respective confirmation messages to the non-controlling device(s) 15 (e.g., network hosts 1 and 3) spuriously indicating that the hardware clock 30 was updated responsively to the respective clock synchronization request messages received from the non-controlling device(s) 15 (e.g., network hosts 1 and 3) without updating the hardware clock 30 responsively to the respective clock synchronization request messages received from the non-controlling device(s) 15 (e.g., network hosts 1 and 3). The term "spuriously indicating" as used in the specification and claims, is defined, as indicating that an action (e.g., updating the hardware clock 30) was performed when in fact the action was not performed. In other words, the clock controller 32 provides a fake compliance with the protocol used by the local devices 15 so that the local devices 15 operate according to the protocol and the clock controller 32 protects the hardware clock 30 from being updated by any of the local devices 15, except the controlling device 15 (e.g., network hosts 2).

Figure 4:
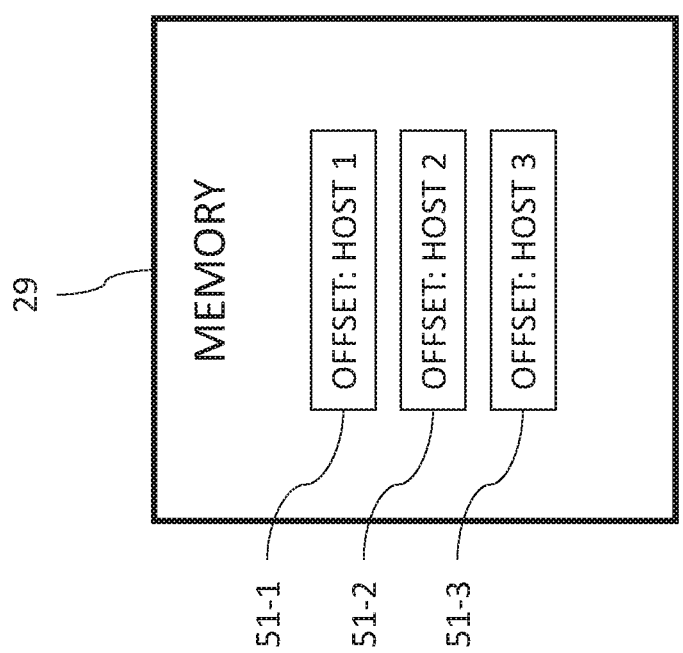
FIG. 4 is a block diagram view of a memory in the multihost system of FIG. 1.

Reference is now made to FIG. 4, which is a block diagram view of the memory 29 in the multihost system 10 of FIG. 1. Reference is also made to FIG. 1. The memory 29 is configured to store respective offsets 51 of respective ones of the local devices 15. In the example, of FIG. 4, the memory 29 is storing an offset 51-1 for the network host 1, an offset 51-2 for the network host 2, and an offset 51-3 for the network host 3. In some embodiments, the memory 29 may also store the offset associated with the baseboard management controller 23. The hardware clock 30 maintains a time value which may include a phase value and/or a frequency value. The phase value may be represented by the value of a counter, which is advanced according to the frequency value. The different local devices 15, while being synchronized with the hardware clock 30, may maintain a phase value which is offset from the phase value (e.g., counter value) of the hardware clock 30 by a given static value. For example, the network hosts 16 may be providing services for different time zones, where network host 1 is providing services in the UK, network host 2 in New York, and network host 3 in New Delhi. Therefore, the different network hosts need to maintain times according to their local time zone. The hardware clock 30 may have a phase which is correct for a particular time zone, e.g., Pacific Time, or it may have a phase which is not linked to a particular time zone. In order for the time value of the hardware clock 30 to be used by the local devices 15, or for the time value of the hardware clock 30 to be set by one of the local devices 15, respective time values retrieved by the clock controller 32 from the hardware clock 30, or respective time values written to the hardware clock 30, are adjusted based on the respective offsets of the respective local devices 15. Although the offsets may generally be static values, the offsets may change occasionally, e.g., due to changes to, or from, daylight savings time.

Therefore, in some embodiments the clock controller 32 is configured to update (block 48 of FIG. 3) the hardware clock 30 responsively to the respective clock synchronization request messages received from the designated controlling device 15 (e.g., network host 2) adjusted by the respective offset 51 (e.g., the offset 51-2) of the designated controlling device 15 (e.g., network host 2) of the local devices 15. Retrieving and adjusting retrieved time is described in more detail with reference to FIG. 5.

Figure 5:
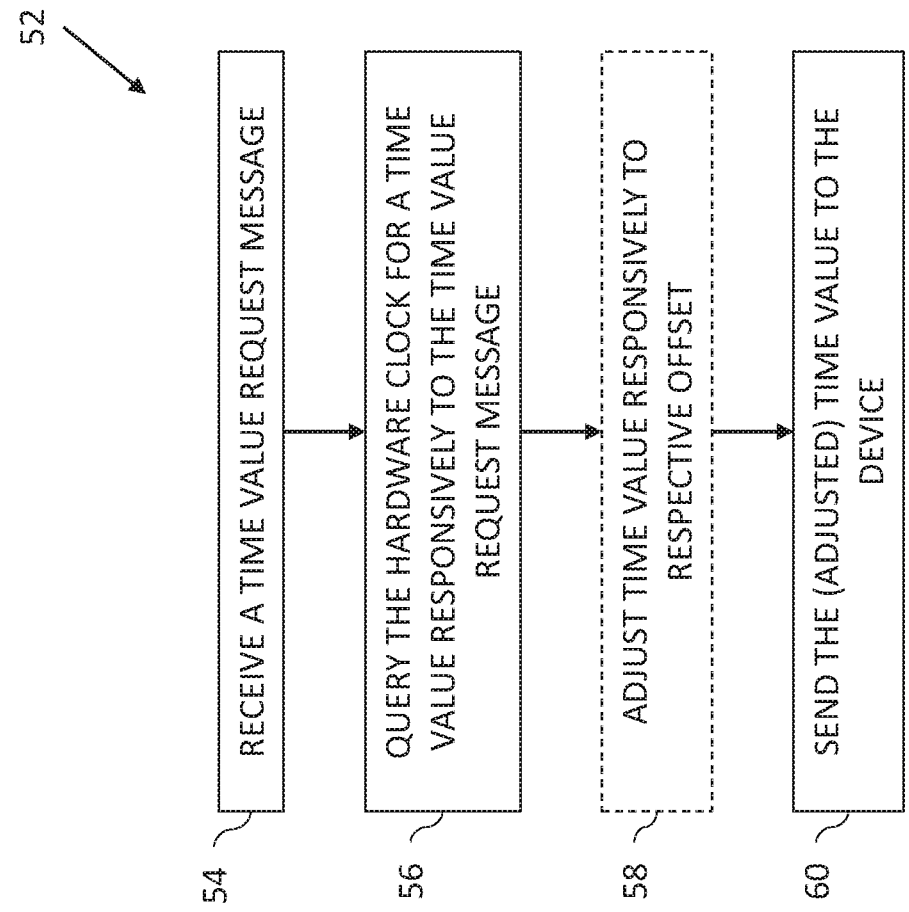
FIG. 5 is a flowchart including steps in a method of processing a time value request in the system of FIG. 1.

Reference is now made to FIG. 5, which is a flowchart 52 including steps in a method of processing a time value request in the system 10 of FIG. 1. Reference is also made to FIG. 1. The clock controller 32 continues to act on and respond to other requests from the clock synchronization clients 24 of the controlling device 15 (e.g., network host 2) and the non-controlling device(s) 15 (e.g., network hosts 1 and 3 and the baseboard management controller 23) according to the protocol, for example, requests for the time value stored by the hardware clock 30. The clock controller 32 is configured to receive (block 54) a time value request message (e.g., get_time( ) and/or get_freq( ) PTP messages) from one of the local devices 15 (e.g., from a non-controlling device 15 (e.g., network host 1)), query (block 56) the hardware clock 30 for a time value responsively to the time value request message, optionally adjust (block 58) the time value responsively to the respective offset (e.g., the offset 51-1 of the network host 1) of the requesting local device (e.g., network host 1), and send (block 60) the (adjusted) time value to the non-controlling device 15 (e.g., network host 1). The above steps of blocks 54-60 may be repeated for time value requests from other non-controlling devices 15 (e.g., network hosts 1 and 3 and the baseboard management controller 23) are well from the controlling device 15 (e.g., network host 2).

Figure 6:
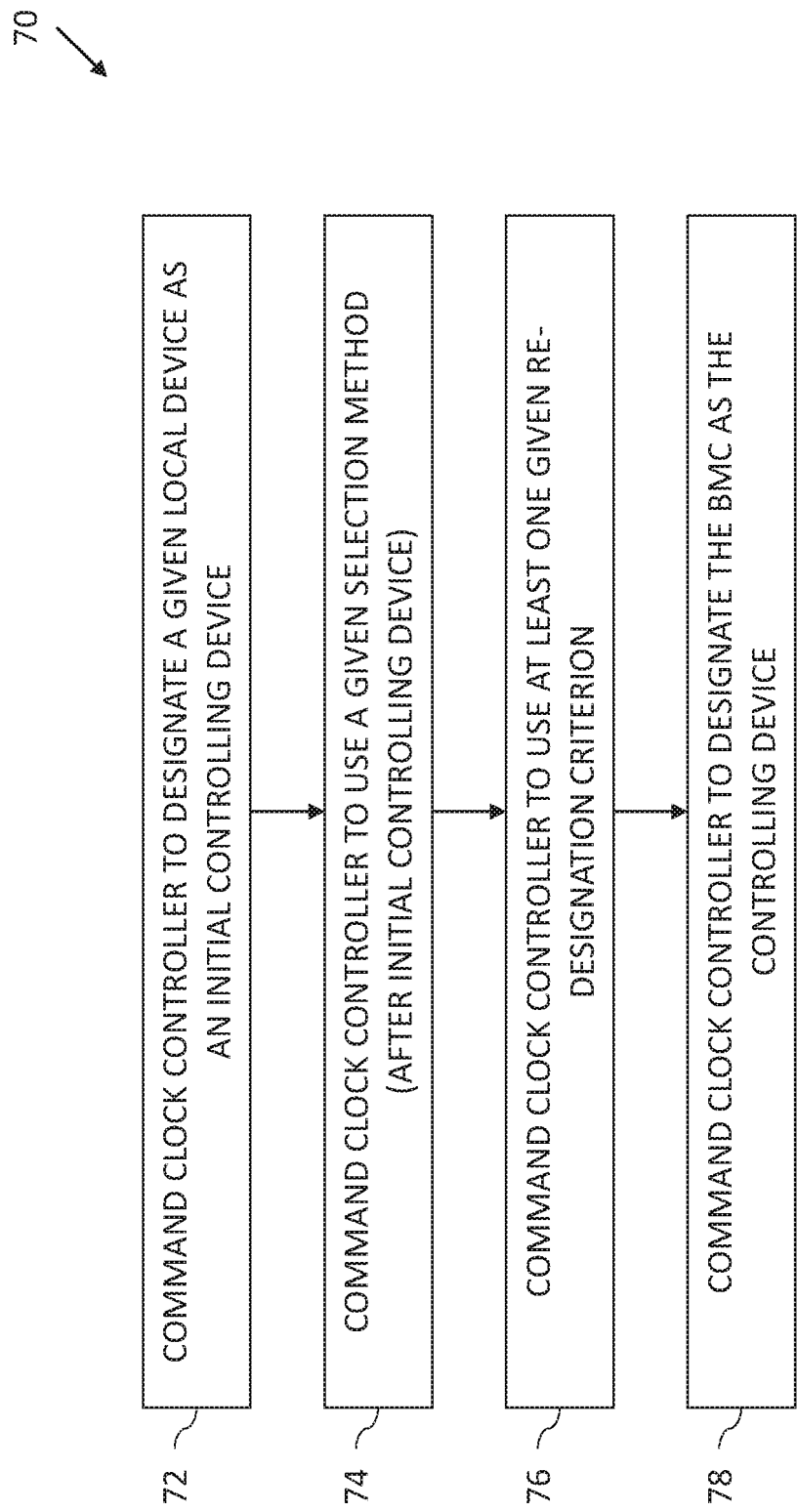
FIG. 6 is a flowchart including steps in a method running on a baseboard management controller of the system of FIG. 1.

Reference is now made to FIG. 6, which is a flowchart 70 including steps in a method running on the baseboard management controller 23 of the system 10 of FIG. 1. Reference is also made to FIG. 1. The baseboard management controller 23 may be configured to command (block 72) the clock controller 32 to designate an initial controlling device of the local devices 15 as the controlling device. The baseboard management controller 23 may be configured to command (block 74) the clock controller 32 to use a given selection method (after the initial controller device), for example, using one of the selection methods described above with reference to FIG. 2. The baseboard management controller 23 may be configured to command (block 76) the clock controller 32 to use at least one re-designation criterion, for example, one or more of the re-designation criteria described above with reference to FIG. 2. The baseboard management controller 23 may be configured to command (block 78) the clock controller 32 to designate the baseboard management controller 23 as the controlling device. The baseboard management controller 23 may command the clock controller 32 to designate the baseboard management controller 23 as the controlling device until an expiration of a given period of time, upon which another one of the local devices 15 is selected by the clock controller 32 as the controlling device. Alternatively, the baseboard management controller 23 may command the clock controller 32 to designate the baseboard management controller 23 as the controlling device until notified otherwise by the baseboard management controller 23 or until reboot of the network interface card device 12 or the baseboard management controller 23. The set( ) and get( ) commands used by the baseboard management controller 23 may be any suitable commands, for example, NC-SI (DSP0222) OEM commands and/or MCTP (DSP0236) Vendor defined messages.

Various features of the invention which are, for clarity, described in the contexts of separate embodiments may also be provided in combination in a single embodiment. Conversely, various features of the invention which are, for brevity, described in the context of a single embodiment may also be provided separately or in any suitable sub-combination.

The embodiments described above are cited by way of example, and the present invention is not limited by what has been particularly shown and described hereinabove. Rather the scope of the invention includes both combinations and subcombinations of the various features described hereinabove, as well as variations and modifications thereof which would occur to persons skilled in the art upon reading the foregoing description and which are not disclosed in the prior art.

What is claimed is:

1. A network interface card device, comprising:
   respective communication interfaces configured to provide data connection with respective local devices configured to run respective clock synchronization clients;
   at least one network interface to provide data connection between a packet data network and ones of the local devices;
   a hardware clock configured to maintain a time value, and serve the clock synchronization clients; and
   a clock controller configured to designate one of the local devices as a controlling device for updating the hardware clock,
   wherein the clock controller is configured to:
     receive clock synchronization request messages generated by the clock synchronization clients of the respective local devices, the clock synchronization request messages including first respective clock synchronization request messages received from the designated controlling device and second respective clock synchronization request messages received from a non-controlling device of the local device; and
     update the hardware clock responsively to first respective clock synchronization request messages received from the designated controlling device.

2. The device according to claim 1, wherein the clock controller is configured to send respective confirmation messages to the non-controlling device without updating the hardware clock responsively to the second respective clock synchronization request messages.

3. The device according to claim 1, wherein the clock controller is configured to select the controlling device in accordance with a selection method responsively to any one or more of the following: a lowest network address of respective ones of the local devices; a highest network address of respective ones of the local devices; an earliest one of respective ones of the local devices to boot; a lowest or highest communication bus device index; a controlling device having a most accurate oscillator of the local devices; an initial controlling device indicated by a baseboard management controller; a random selection from respective ones of the local devices; or selection from an ordered list of respective ones of the local devices on a round robin basis.

4. The device according to claim 2, wherein the selection method is commanded by the baseboard management controller.

5. The device according to claim 1, wherein the clock controller is configured to re-designate one of the local devices as a controlling device according to at least one re-designation criterion, responsively to any one or more of the following: the designated controlling device being non-responsive for more than a threshold time period; the designated controlling device being designated for a given or random time period; detecting a power-state change of the designated controlling device; detecting a driver start and/or driver stop on the designated controlling device; or detecting a driver start and/or driver stop on one of the local devices.

6. The device according to claim 5, wherein the at least one re-designation criterion is commanded by a baseboard management controller.

7. The device according to claim 1, wherein the clock controller is configured to:
receive a time value request message from the non-controlling device;
query the hardware clock for a time value responsively to the time value request message; and
send the time value to the non-controlling device.

8. The device according to claim 1, wherein the local devices include network hosts.

9. The device according to claim 8, wherein the local devices include a baseboard management controller.

10. The device according to claim 9, wherein the designated controlling device is the baseboard management controller.

11. The device according to claim 10, wherein the baseboard management controller is designated as the controlling device responsively to a command from the baseboard management controller to designate the baseboard management controller as the controlling device.

12. The device according to claim 1, further comprising a memory configured to store respective offsets of respective ones of the local devices, the clock controller being configured to:
update the hardware clock responsively to the first respective clock synchronization request messages received from the designated controlling device adjusted by a respective one of the offsets of the designated controlling device of the local devices;
receive a time value request message from a first one of the local devices;
query the hardware clock for a time value responsively to the time value request message;
adjust the time value responsively to a respective one of the offsets of the first local device; and
send the adjusted time value to the first local device.

13. A network interfacing method, comprising:
providing data connection with respective local devices configured to run respective clock synchronization clients;
providing data connection between a packet data network and ones of the local devices;
maintaining a time value by a hardware clock;
designating one of the local devices as a controlling device for updating the hardware clock;
receiving clock synchronization request messages generated by the clock synchronization clients of the respective local devices;
updating the hardware clock responsively to first respective ones of the clock synchronization request messages received from only the designated controlling device, and sending respective confirmation messages to the designated controlling device indicating that the hardware clock was updated responsively to the first respective ones of the clock synchronization request messages; and
sending respective confirmation messages to a non-controlling device of the local devices spuriously indicating that the hardware clock was updated responsively to second respective ones of the clock synchronization request messages received from the non-controlling device.

14. The device according to claim 1, wherein the clock controller is configured to:
send respective confirmation messages to the designated controlling device indicating that the hardware clock was updated responsively to the first respective clock synchronization request messages; and
send respective confirmation messages to the non-controlling device spuriously indicating that the hardware clock was updated responsively to the second respective clock synchronization request messages received from the non-controlling device.

15. The method according to claim 13, wherein the sending the respective confirmation messages to the non-controlling device includes sending the respective confirmation messages to the non-controlling device without updating the hardware clock responsively to the second respective ones of the clock synchronization request messages.

16. A network interface card device, comprising:
respective communication interfaces configured to provide data connection with respective local devices configured to run respective clock synchronization clients;
at least one network interface to provide data connection between a packet data network and ones of the local devices;
a hardware clock configured to maintain a time value;
a memory configured to store respective offsets of respective ones of the local devices; and
a clock controller configured to:
receive clock synchronization request messages generated by a first one of the clock synchronization clients of a first respective one of the local devices;
update the hardware clock responsively to the clock synchronization request messages adjusted by a respective one of the offsets of the first respective one of the local devices;
receive a time value request message from a second one of the local devices;
query the hardware clock for a time value responsively to the time value request message;

adjust the time value responsively to a respective one of the offsets of the second local device; and send the adjusted time value to the second local device.

17. A network interfacing method, comprising:

providing data connection with respective local devices configured to run respective clock synchronization clients;

providing data connection between a packet data network and ones of the local devices;

maintaining a time value by a hardware clock;

storing respective offsets of respective ones of the local devices;

receiving clock synchronization request messages generated by a first one of the clock synchronization clients of a first respective one of the local devices;

updating the hardware clock responsively to the clock synchronization request messages adjusted by a respective one of the offsets of the first respective one of the local devices;

receiving a time value request message from a second one of the local devices;

querying the hardware clock for a time value responsively to the time value request message;

adjusting the time value responsively to a respective one of the offsets of the second local device; and sending the adjusted time value to the second local device.

18. A system comprising:

a network interface card device comprising:

respective communication interfaces configured to provide data connection with respective local devices configured to run respective clock synchronization clients;

at least one network interface to provide data connection between a packet data network and ones of the local devices;

a hardware clock configured to maintain a time value; and a clock controller configured to: designate one of the local devices as a controlling device for updating the hardware clock; receive clock synchronization request messages generated by the clock synchronization clients of the respective local devices; update the hardware clock responsively to first respective ones of the clock synchronization request messages received from the designated controlling device, and send respective confirmation messages to the designated controlling device indicating that the hardware clock was updated responsively to the first respective ones of the clock synchronization request messages; and send respective confirmation messages to a non-controlling device of the local devices spuriously indicating that the hardware clock was updated responsively to second respective ones of the clock synchronization request messages received from the non-controlling device; and the local devices comprising network hosts and a baseboard management controller.

19. The system according to claim 18, wherein the clock controller is configured to send the respective confirmation messages to the non-controlling device indicating that the hardware clock was updated responsively to the second respective ones of the clock synchronization request messages received from the non-controlling device without updating the hardware clock responsively to the second respective ones of the clock synchronization request messages.

20. The system according to claim 18, wherein: the clock controller is configured to select the controlling device in accordance with a selection method; and the baseboard management controller is configured to command the clock controller to use the selection method.

21. The system according to claim 20, wherein the baseboard management controller is configured to command the clock controller to designate an initial controlling device of the local devices as the controlling device.

22. The system according to claim 18, wherein: the clock controller is configured to re-designate one of the local devices as a controlling device according to at least one re-designation criterion; and the baseboard management controller is configured to command the clock controller to use the at least one re-designation criterion.

23. The system according to claim 18, wherein the designated controlling device is the baseboard management controller.

24. The system according to claim 23, wherein the baseboard management controller is configured to command the clock controller to designate the baseboard management controller as the controlling device.

* * * * *